United States Patent [19]

Cordell

[11] Patent Number: 5,055,841

[45] Date of Patent: Oct. 8, 1991

[54] HIGH-SPEED FEEDFORWARD VARIABLE WORD LENGTH DECODER

[75] Inventor: Robert R. Cordell, Middletown, N.J.

[73] Assignee: Bell Communications Research, Inc., Livingston, N.J.

[21] Appl. No.: 649,655

[22] Filed: Feb. 1, 1991

[51] Int. Cl.$^5$ .............................................. H03M 7/40
[52] U.S. Cl. ...................................... 341/67; 341/106
[58] Field of Search ....................... 341/63, 64, 65, 67, 341/106, 107

[56] References Cited

U.S. PATENT DOCUMENTS

| | | | |
|---|---|---|---|
| 3,675,211 | 7/1972 | Raviv | 341/67 |
| 3,675,212 | 7/1972 | Raviv et al. | 341/67 |
| 4,044,347 | 8/1977 | Van Voorhis | 341/67 |
| 4,516,246 | 5/1985 | Kenemuth | 341/67 X |
| 4,551,706 | 11/1985 | Hunt | 341/63 |
| 4,616,211 | 10/1986 | Ross et al. | 341/67 |
| 4,899,149 | 2/1990 | Kahan | 341/67 |

*Primary Examiner*—Howard L. Williams
*Attorney, Agent, or Firm*—Leonard Charles Suchyta; Stephen M. Gurey

[57] ABSTRACT

A variable word length (VWL) decoder is disclosed in which an input bit stream of variable length words is input to a programmable logic array (PLA) (305) through an input shift register (302). The data association input plane (306) of the PLA compares the sequence of input bits in the register with all the possible variable length words. When a match is made, the PLA's length output plan (307) produces an output word representing the length of the detected variable length word and the PLA's word output plan (308) produces the fixed length word corresponding to the input VWL word. This fixed length word is input to a latch which is controlled by a downcounter (311). The length word is loaded into this downcounter, which decrements its count as the input bits are shifted through the register. Only when its count reaches zero have all bits of the previous variable length word been clocked through the shift register. Therefore, only on the count of zero does the output of the word output plane represent a fixed length word that properly corresponds to a valid VWL input word. Thus, only on the count of zero is the latch enabled to transfer to its output the word then at the output of the word output plane. The feedforward only architecture of the VWL decoder does not require any information regarding the decoded word length to be fed back to the input. This architecture is therfore not limited by speed constraints that would otherwise exist if the length of each decoded word needed to be fed back to the input before the next word could be decoded.

9 Claims, 5 Drawing Sheets

HIGH-SPEED FEEDFORWARD VARIABLE WORD LENGTH DECODER

BACKGROUND OF THE INVENTION

This invention relates to decoding codewords in a high speed data transmission system, and more particularly to decoding codewords which have been encoded using a variable word length (VWL) coding scheme.

Variable word length coding is a coding technique often used for lossless data compression. In accordance with this technique, fixed-length data is converted into variable-length codewords according to the statistics of the data. In general, the lengths of the codewords are chosen so that shorter codewords are used to represent the more frequently occurring data and longer codewords are chosen to represent the less frequently occurring data. By properly assigning the variable-length codewords to the library of all possible source codewords, the averaged word length of the variable-length code is shorter than that of the original data and, therefore, data compression is achieved. Huffman code design is a procedure commonly used to construct a minimum redundant variable word length code for a known data statistic. Generally, the encoding process can be implemented by a table-lookup process using the input data to address the table. The codewords and wordlengths are stored as table contents and outputted sequentially, through a buffer, at a constant data rate onto the data channel. At the receiving end, however, the decoding process is more complicated. Due to the variable-length nature, each codeword has to be segmented from the received bit string before it can be decoded into a source symbol. Therefore, the design of a variable word length decoder is always more difficult than the design of a variable word length encoder.

There are several methods to decode a stream of variable word length codewords. The one most often used is called the tree-searching algorithm. A variable word length code can always be represented by a tree with codewords as leaves (also called terminal nodes). The decoding starts from the root of the code tree and is guided by the received bit string to follow one of two branches at each node. When a leaf is reached, the end of a codeword is detected and it is segmented from the remaining string. This type of decoder includes logic circuitry corresponding to the tree and control circuitry to traverse the code tree. This approach may be slow, especially for long codewords, since a bit-by-bit search through the code tree is required for each decoded symbol.

High-speed requirements are particularly critical for the transmission of digitized high definition television (HDTV) signals. In such a digital HDTV system, it is expected that the digital video signal can be coded using high compression techniques so that all the video information is transmitted over a single 155 Mb/sec broadband ISDN (BISDN) channel. Variable word length decoding is difficult to achieve at these speeds that permit a single variable word length decoder to handle all the video information. In particular, the high speed processing that is required in a variable word length decoder is difficult to achieve with low-cost very large scale integrated (VLSI) circuit technology such as 1.2 micron CMOS VLSI technology currently of interest.

Due to the difficulty of implementing high-speed variable word length decoders, there are several special variable word length codes designed for fast and inexpensive decoders. For example, a variable word length encoder with a length-indicating prefix is proposed by J. Cocke et al in U.S. Pat. No. 3,717,851 issued Oct. 24, 1972. In "Variable Word Length Coding for a High Data Rate DPCM Video Coder," *Proc. of Picture Coding Symposium*, 1986, pp. 54–56, M. E. Lukacs proposed a hardware architecture that is capable of fast decoding of specially designed variable word length codes. These approaches tradeoff coding efficiency with hardware speed.

A table-lookup based approach is an alternative to the bit-by-bit search operation. In a table-lookup based approach, such as disclosed in U.S. Pat. No. 3,675,212, issued on July 4, 1972 to J. Raviv et al, the received bit string is compared with the contents of a codeword table. The codeword table has an entry associated with each possible variable word length codeword that includes the decoded fixed-length word and the length of the variable length word. When the sequence of leading bits in an input register matches one of the entries in the codeword table, a codeword match is indicated. The input register is then shifted by the number of bits indicated by the code length entry, thereby making the next sequence of bits available for comparison with entries in the codeword table. Feedback to the input is required to inform the input register of the number bits to shift after each variable-length word is decoded. It is this time-consuming feedback around the processing elements of prior art variable-length decoders that has limited their use for high-speed applications.

An object of the present invention is to decode variable-length codewords by means of a feedforward only decoder architecture, which does not require the length of each decoded codeword to be fed back to the input of the decoder, thereby advantageously increasing the processing speed capabilities of the decoder.

SUMMARY OF THE INVENTION

The variable word length decoder of the present invention uses a table-lookup technique to decode the sequentially occurring bits in the received bit stream. As in the prior art, a memory device has a stored entry for each possible variable word length input codeword. A stored word length indicator and a stored fixed-length output codeword are associated with each possible variable-length input codeword. When a string of input bits, which are continuously clocked through an input shift register at a constant bit rate, are recognized by the memory device as one of the variable word length codewords, the associated fixed-length codeword is outputted to an output latch, which is enabled by the zero-state of a downcounter. At the same time, this counter is loaded with the associated word length indicator, which is numerically equal to one less than the length of the just recognized variable length word. Each subsequent clock pulse decrements the counter's count by one. When the count reaches zero, all the bits of the preceding variable-length word will have been clocked out of the shift register and the remaining and new bits in the shift register constitute the next part of the input stream to be decoded. In particular, the next word to be decoded will be properly aligned for decoding, with its first bit located at the bottom, or last position of the shift register. Thus, only when the count of the counter is zero, is the output of the memory device a fixed-length word that is appropriately associated with the undecoded stream then in the input shift register. The same is true of the length-indicating output of the memory device. Only at the count of zero, therefore, does the counter produce an enabling signal to the output latch that effects a transfer of the fixed-length word then at the output of the memory device to the output of the decoder. Similarly, only at the count of zero is the counter loaded with the new length-indicating output from the memory device. At each other count, the counter inhibits what then is an invalid output of the memory device from being transferred to the decoder output. Output from the memory device is invalid at those times because the bits presented to the memory device are not aligned on the border of a variable-length word.

This feedforward-only variable word length decoder architecture does not require any information regarding the length of each detected word to be fed back to the input of the decoder. Speed constraints present in prior art decoders which do require feedback around the major processing elements, are therefore minimized. Since the decoder described herein has no feedback, one embodiment of the present invention incorporates pipelining and delay matching techniques to increase the speed capabilities of the decoder. In particular, an analog delay is introduced between the input clock and the clock inputs of the counter and the latch controlled by the counter. This delay, sized in consideration of the estimated minimum and maximum delay of the memory element, gives the memory element more time to respond by delaying the point in time when its outputs will be sampled. An additional subsequent latch then resynchronizes the output of the first latch with the undelayed input clock.

An additional embodiment of the present invention incorporates a prefix decoding technique in which certain variable word length codes are used to instruct the decoder to directly read a fixed number of subsequent bits into the output bit stream, the complete decoded word is then formed by combining these directly read bits with some bits corresponding to the prefix. This technique gives most of the advantages of a decoder of longer maximum codeword length without significant increase in the size of the memory element.

DETAILED DESCRIPTION

Figure 1:
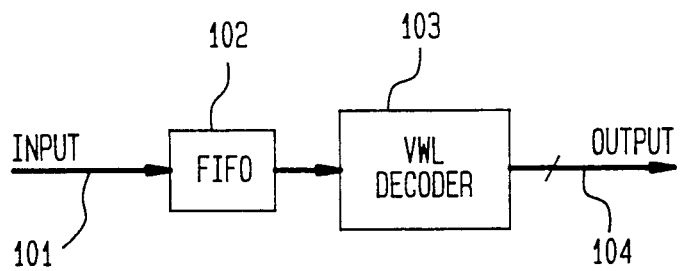
FIG. 1 is a block diagram of a prior art receiver in which the received bit stream of variable length words is input to a first-in first-out (FIFO) storage device at the line rate, which produces a variable bit rate input to a variable word length decoder which, in turn, outputs fixed length words at a constant word rate.

Although the bit rate of the received signal in a system incorporating variable word length encoding is relatively constant, the received word rate is obviously not constant due to the varying lengths of the received words. Accordingly, in order to convert a received input bit stream consisting of variable length words into an output bit stream of fixed length words at a constant word rate, a receiver incorporating a variable word length decoder requires a bit storage device. FIG. 1 shows one type of receiver architecture in the prior art in which the input bit stream on lead 101 is input at a relatively constant bit rate to a first-in first-out (FIFO) bit storage device 102. The output of FIFO 102 is connected to a variable word length (VWL) decoder 103. VWL decoder 103 is controlled by a constant word clock (not shown) to produce an output on parallel leads 104 which is at a substantially constant word rate. In order to maintain processing at the word rate, bits must be clocked into decoder 103 at a rate, depending on the length of the variable length word, that is substantially greater than the word rate. This problem of very high speed processing in a receiver structure of the type shown in FIG. 1 is addressed in co-pending patent application Ser. No. 546,415, filed June 29, 1990. In the variable word length decoder disclosed in that application, bit shifting at high speeds is reduced by using a barrel shifter, which provides a decoding window that is directly shifted each time a word is detected. Feedback from the output of the processing element to the barrel shifter at the input is required, however, to effect shifting of the decoding window to the next undecoded sequence of input bits.

Figure 2:
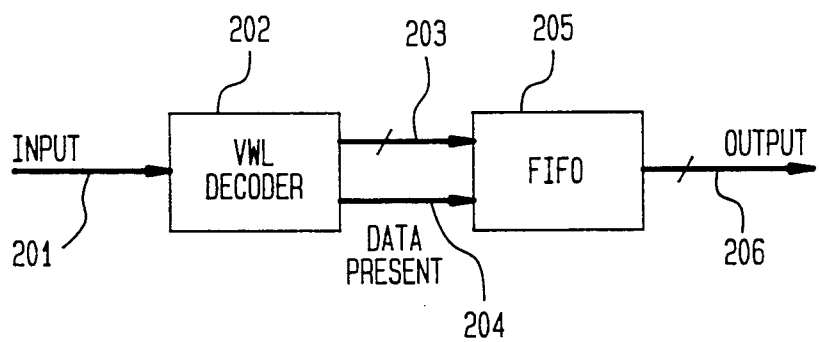
FIG. 2 is a block diagram of a prior art receiver of the type used by the present invention in which the constant bit rate received stream of variable length words is input directly to the variable word length decoder, which produces a variable word rate input of fixed length words to a FIFO, which in turn outputs the fixed length words at a constant word rate.

FIG. 2 shows an alternative receiver architecture in the prior art which incorporates the variable word length decoder of the present invention. In this receiver the received input bit stream on lead 201 is directly input to the VWL decoder 202, which produces fixed length words at a variable word rate on parallel output leads 203. Decoder 202 also produces a non-periodic clocking signal on data present lead 204 at this variable word rate, which clocks the fixed length words on leads 203 into a FIFO buffer 205. The contents of FIFO 205 may then be clocked out onto parallel output leads 206 at a constant word rate, or at a rate appropriate to the needs of the subsequent processing circuitry.

Figure 3:
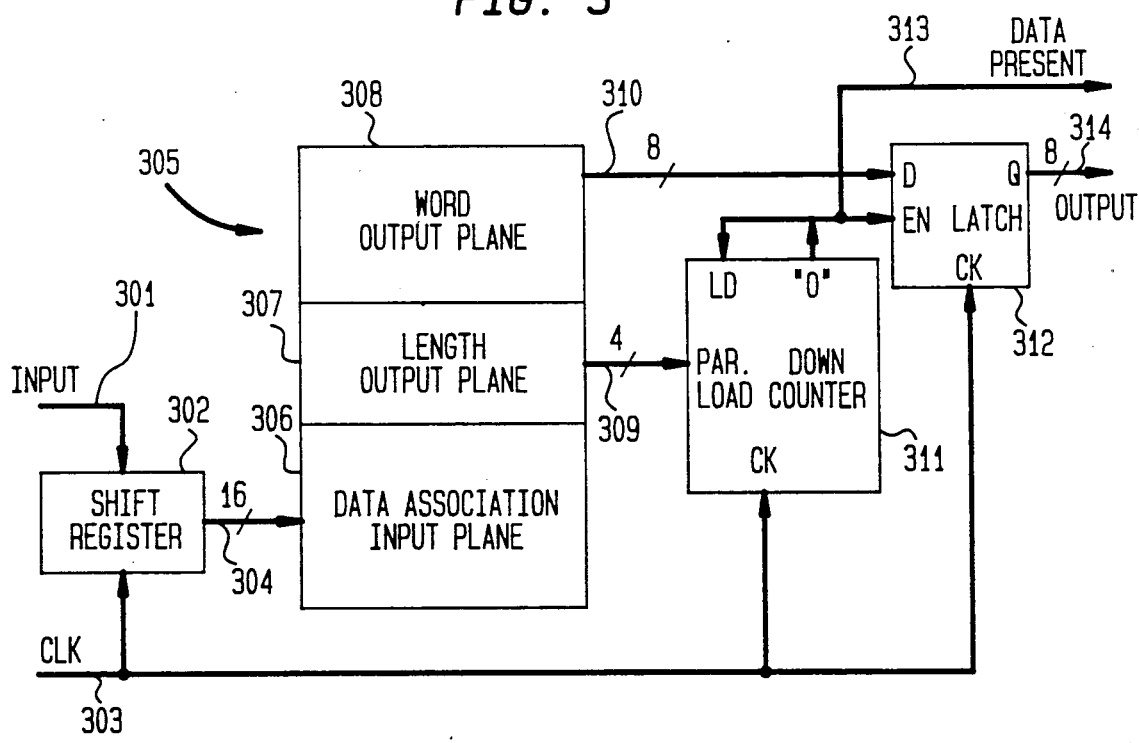
FIG. 3 is a block diagram of the variable word length decoder of the present invention.

FIG. 3 is a block diagram of a variable word length decoder, in accordance with the present invention, that can be used in the receiver architecture of FIG. 2. For purposes of illustration it will be assumed that there are 256 possible variable word length codewords to be decoded having between 2 and 16 bits per word. Each variable length codeword can be decoded into an 8-bit fixed length word. The input serial bit stream on lead 301, at the line rate, consists of sequential variable length codewords whose word borders are implicitly indicated by the code once decoding synchronization is achieved. Data compression is realized using variable length coding by analyzing the statistics of the input data and assigning the shorter codewords to those more frequently occurring input words and the longer codewords to the less frequently occurring input words.

Table 1 illustrates a simple VWL code that implements ten codewords (the codebook) with a maximum word length n of 5 bits.

TABLE 1

A sample VWL code with ten codewords.

| codeword | bit # 0 | 1 | 2 | 3 | 4 |
|---|---|---|---|---|---|
| 0 | 0 | 0 | | | |
| 1 | 0 | 1 | | | |
| 2 | 1 | 0 | 0 | | |
| 3 | 1 | 0 | 1 | | |
| 4 | 1 | 1 | 0 | 0 | |
| 5 | 1 | 1 | 0 | 1 | |
| 6 | 1 | 1 | 1 | 0 | 0 |
| 7 | 1 | 1 | 1 | 0 | 1 |
| 8 | 1 | 1 | 1 | 1 | 0 |
| 9 | 1 | 1 | 1 | 1 | 1 |

Word boundaries are recognized by the fact that no shorter word has the same leading bits. This is called the prefix property. By rotating Table 1 onto its side and filling in empty bit positions in codewords with "don't cares," the method of decoding variable length codewords employed by the VWL decoder of the present invention is illustrated. Table 2 shows Table 1 rotated with "X" being used to indicate a "don't care."

TABLE 2

Decoding algorithm for VWL code with ten codewords.

| | | | | | | | | | | |
|---|---|---|---|---|---|---|---|---|---|---|
| b4 | X | X | X | X | X | X | 0 | 1 | 0 | 1 |
| b3 | X | X | X | X | 0 | 1 | 0 | 0 | 1 | 1 |
| b2 | X | X | 0 | 1 | 0 | 0 | 1 | 1 | 1 | 1 |
| b1 | 0 | 1 | 0 | 0 | 1 | 1 | 1 | 1 | 1 | 1 |
| b0 | 0 | 0 | 1 | 1 | 1 | 1 | 1 | 1 | 1 | 1 |
| | c0 | c1 | c2 | c3 | c4 | c5 | c6 | c7 | c8 | c9 |

The process for decoding data encoded with the simple codebook of Tables 1 and 2 can be explained as follows: Assuming that the system is in sync and the last codeword has been decoded, the next five bits are lined up column wise against Table 2 and compared with each of the 10 columns. Where a "don't care X" is indicated as a bit entry, a match occurs at that position regardless of what the input bit is. The five input bits b0–b4 will thus match one of the codeword columns and the detected output word is that one codeword, c0–c9, at which a match on b0–b4 occurs. That particular decoded VWL codeword can then be converted into a corresponding fixed length codeword by a straightforward table lookup means. After that particular VWL codeword is detected, the first bit in the next variable length word in the input bit stream begins after the last bit in the just decoded variable length word. As an example, if bits b0–b4 are "01110", a match occurs on codeword c1 ("01"). The next word will thus begin with "110" as bits b0–b2.

As previously noted, for the system in FIG. 3, the VWL codebook consists of 256 words whose length varies between 2 and 16 bits, which words are decoded into 8-bit words. With reference back to FIG. 3, the input stream of successive variable length words on lead 301 is input to a 16-bit shift register 302 in response to a clocking signal on lead 303. The bits in the sixteen bit storage locations of shift register 302 are available as outputs on parallel leads 304 to the input of a memory device 305. Memory device 305, in this embodiment, is a programmable logic array (PLA), which will be described hereinafter. PLA 305 has a data association input plane 306 and two associated output planes, length output plane 307 and word output plane 308. In the data association plane 306, the 16 bits on leads 304 are compared column wise with each of the 256 possible variable length words in a manner identical to that described above in conjunction with Table 2. It is assumed that, at this point, the input to the shift register 302 is the beginning of the bit stream and the first bit in the lowest bit position is the first bit of the first VWL codeword. These initial 16 bits from shift register 302 on leads 304 are identified with one of the codeword columns in the data association plane 306 at the clock instant at which the first bit is shifted into the lowest bit position. Once data association plane 306 identifies these bits with the particular matching column, the length output plane 307 produces a 4-bit output word on parallel leads 309 corresponding to the length of the just recognized word, and the word output plane 308 produces an 8-bit output word on parallel leads 310 corresponding to the 8-bit fixed length representation of the just decoded variable length word. In particular output 309 of length output plane 307 is numerically equal, in binary format, to one less than the length of the recognized word. In response to the next clock pulses, the bits in shift register 302 are shifted downward one-by-one, the bit in the bottom storage location of the register being dropped and a bit from the input bits stream on lead 301 being shifted into the top storage location. As will be described in detail hereinafter, the outputs of memory device 305 are ignored until all the bits from the just recognized word have been clocked out of the shift register 302 and the first bit on the next VWL codeword is in the bottom lowest storage location of the register.

Figure 4:
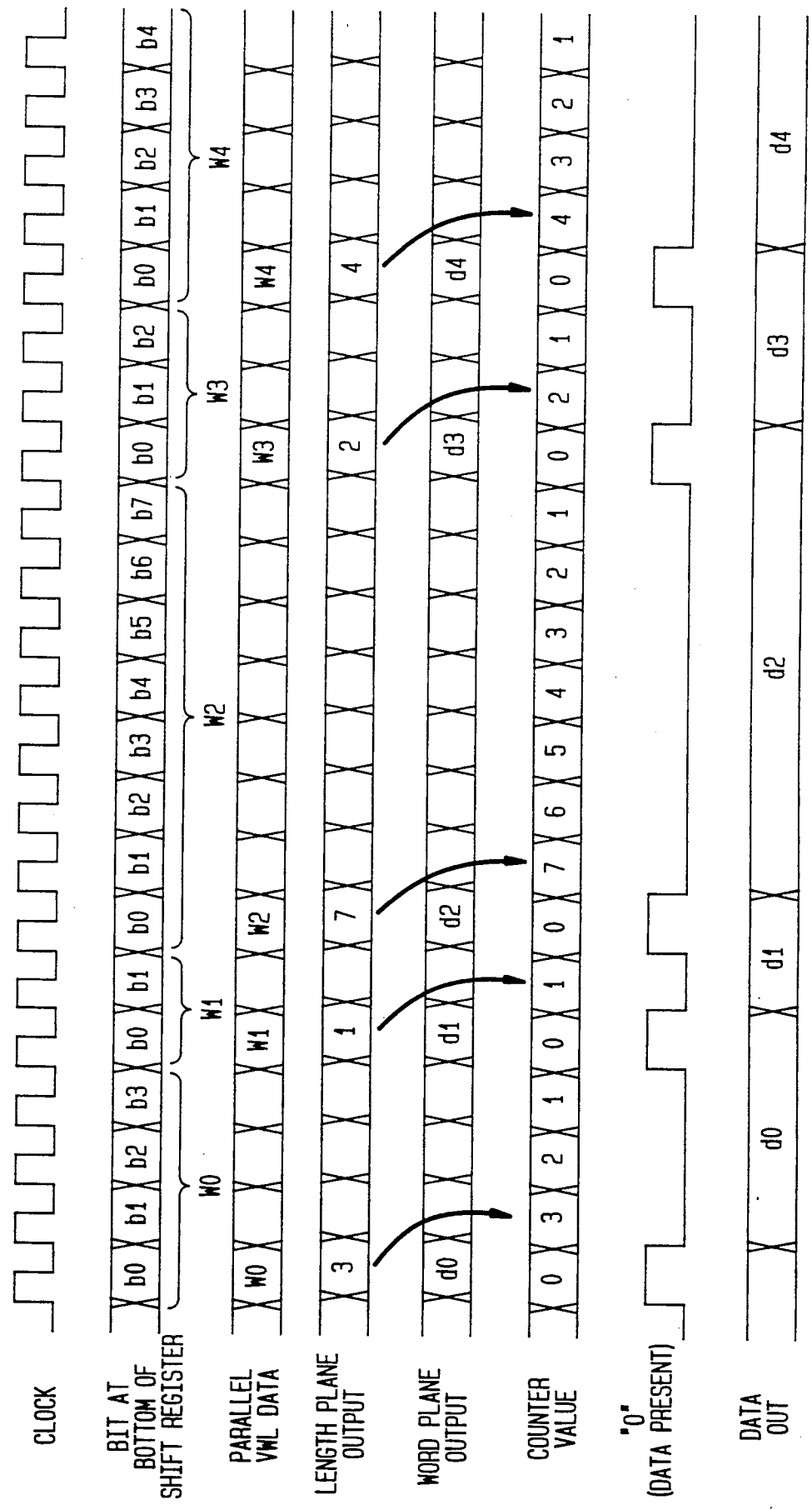
FIG. 4 shows timing diagrams useful for explaining the operation of the embodiment of the present invention in FIG. 3.

FIG. 4 shows the timing relationships between the clock pulses on lead 303, the bits in the bottom lowest bit position of shift register 302, the inputs and outputs of PLA 305, and the inputs and outputs of counter 311 and latch 312, these latter two elements to be described hereinafter. In FIG. 4 it can be noted that the first four bits, b0–b3, of the input bits stream represent word w0, which are recognized by data association plane 306. After a short processing time, the length output plane produces a parallel output equal, as noted above, to one less than the number of bits of the just detected word (see "3" in FIG. 4 on "length plane output" timing line), and the word output plane produces the eight bit fixed length word, d0, corresponding to the just recognized 4-bit variable length word (see "d0" in FIG. 4 on "word plane output" timing line).

The output leads 309 of length output plane 307 are connected to the Parallel Load input of a downcounter 311. In response to each clock pulse on lead 303 input to its CK input, downcounter 311 decrements its count by one. When the count reaches zero, the "0" output of downcounter 311 is energized thereby activating the counter's load LD input, which thereupon causes the count then on input leads 309 to be loaded in. The "0" output of downcounter 311 is also connected to the enable EN input of latch 312 and to Data Present lead 313. The parallel output leads 310 of word output plane 308 are connected to the D input of latch 312. As will be described, only when the count of downcounter 311 is zero does latch 312 enable the word then on leads 310 to be latched to parallel output leads 314 at the Q output of latch 312. At times when the count of counter 311 is not zero, the Data Present lead 313 is deenergized and latch 312 is disabled, thereby inhibiting what would be invalid data word on leads 310 from reaching output leads 314.

With reference to the timing diagrams in FIG. 4, it is assumed that counter 311 has the count of zero at the beginning of the portion of the variable word length bit stream shown in FIG. 4. Thus during the first clock pulse interval, the "0" (Data Present) lead 313 is energized, as can be observed, indicating the availability of the previously decoded word (not shown). In response to the leading edge of the clock pulse that follows the energization of the enable EN input of latch 312, the bits then on leads 310 at the output of word output plane 308 are latched to the output leads 314 of latch 312. As can be noted, therefore, the first word plane output word, d0, remains as the "Word Output" until replaced with the next word. As noted from the "Counter Value" timing line, after the count of counter 311 reaches zero, the next clock pulse causes the output of the length output plane 307 to be loaded in. Thus after the initial "0", the value of "3" is loaded into counter 311. As can be noted, the "Counter Value" is decremented by one at each subsequent clock pulse.

As noted, at each subsequent clock pulse, the input bits stream on lead 301 is shifted bit-by-bit through shift register 302, presenting, on leads 304, a shifted sequence of 16-bits to data association input plane 306, a new input bit being added to the top bit storage location as the previous bit in the bottom storage location is dropped off. At each of these clock instants, a match is attempted between the bits then in the 16 bit storage locations available on leads 304, and one of the 256 possible code words. If a match occurs, however, will not correspond to a valid word if the counter value is still nonzero, and any resultant output of the length or word planes 307 and 308, respectively, represents invalid "noise" data. Proper alignment of a new VWL word at the input to the data association input plane occurs only when the count is zero. Since, however, the count of counter 311 is greater than zero at any of these clock instants, the lack of an energizing signal at the EN input of latch 312 inhibits this invalid "noise" data at the output of word output plane 308 from being latched to output leads 314. Similarly, the invalid "noise" data at the output of length output plane 307 is inhibited from being loaded into downcounter 311.

As can be noted again in FIG. 4, after the four bits of word w0 have been clocked out of the shift register 302, the "Counter Value" is again at "0" and the next group of bits sitting at the bottom of shift register 302 and at the input to data association input plane 306, represent the beginning of the next variable length codeword. Word w1, a two-bit word is next identified and the corresponding fixed-length eight-bit word, d1, appears on lead 310, and its word length, less one, appears on leads 309. Thus counter 311 is loaded with "1" and word d1 is latched to the output 314 at the leading edge of the next clock pulse. After the two bits of w1 are shifted out of the shift register 302, the eight-bit word w2 is at the bottom of the shift register 302 and is the input to data association input plane 306. The value "7" is loaded into counter 311 and the associated 8-bit fixed length word, d2, appears on output leads 314. As the next seven bits are clocked through shift register 302, all outputs of word output plane 308 are ignored by latch 312.

As can be noted from the "Data Output" timing line in FIG. 4, the fixed length words are not output at a regular rate and thus cannot be clocked into a storage device at a regular rate. Therefore, referring back to FIG. 2, the decoder output is input to a FIFO 205 in response to a signal on Data Present lead 204. The signal on lead 204 thus corresponds to the signal on lead 313 in FIG. 3, which is used to clock the output of latch 312 into the FIFO 205 of FIG. 2.

Advantageously, the decoder circuitry described hereinabove does not require information regarding the decoded word length to be fed back to the input of the device. The input bit stream is shifted along at a constant data rate in response to the clocking signal, and each variable length word is sequentially decoded. This feedforward only architecture is therefore not limited by speed constraints that would otherwise exist if the length of each just decoded word needed to be fed back to the input before the next word could be decoded.

Figure 5:
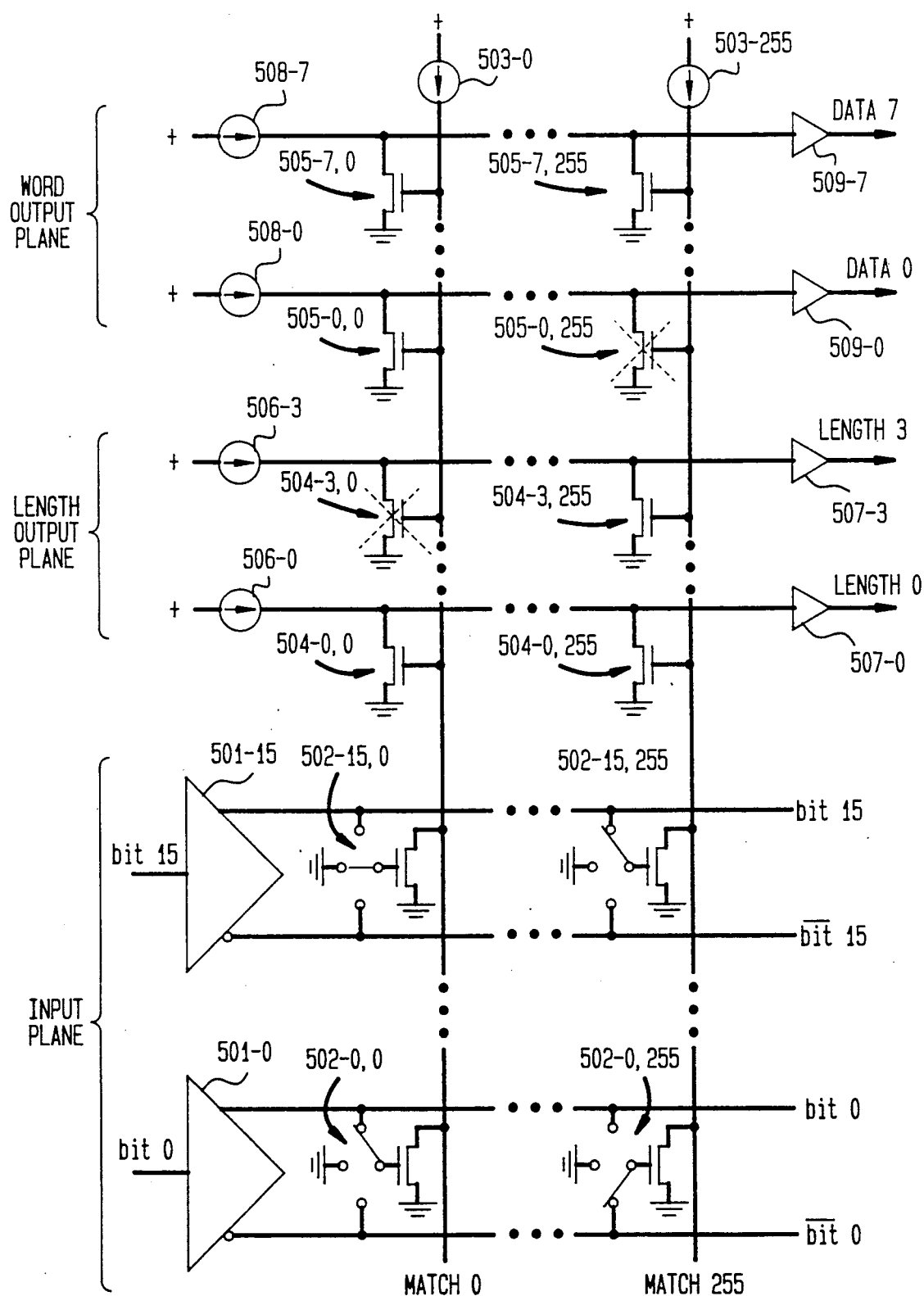
FIG. 5 shows a schematic diagram of a portion of the memory device used by the decoder in FIG. 3.

As described above, the decoder in FIG. 3 incorporates a well known programmable logic array (PLA) 305 structure as a memory device for matching each sequence of input bits with a set of all possible variable length codewords and producing, when matched, corresponding fixed length outputs representing the codeword length and its associated fixed length codeword. Other memory devices that provide the required data-association capabilities are also suitable for use in this invention. FIG. 5 shows a schematic diagram of a portion of a PLA structure that is suitable for use in this application. The 16 input bits, bit 0-bit 15, are input through row drivers 501-0-501-15 which generate bit and inverted bit outputs. The bit and inverted bit outputs associated with each input bit are connected across mask-programmed elements 502-$i,j$ of the input plane of the PLA. Each element 502-$i,j$ consists of an FET whose source is grounded and whose drain is connected to one of the 256 match lines, match 0-match 255, associated with each of the possible variable length code words. The gate of each FET is connected to the bit line, to the inverse bit line, or to ground depending on whether the element is programmed to "look for" a "0", a "1", or is a "don't care" element, respectively. For example, in FIG. 5 element 502-15,0 is programmed to be a "dont't care" element, elements 502-15,255 and 502-0,0 are programmed to look for a "0" and element 502-0,255 is programmed to look for a "1".

When a match in made between the 16 input bits and each of the programmed elements connected to a match line, all the FETs in the column are "off" and the match line is kept "on" ("high") by the particular current source, 503-0-503-255 connected to that line. Any mismatch between any of the input bits and a preprogrammed element turns the associated FET "on" causing the match line connected to that element to go "off" ("low"). Only one match line will remain "on" ("high") for a sequence of 16 input bits.

Each match line is connected to elements 504-$i,j$ in the length output plane and to elements 505-$i,j$ the word output plane. Depending on whether a bit in the length or data word is to be a "0" or a "1", each element consists of either an FET or the absence of an FET, respectively. For those elements 504-$i,j$ in the length plane that are to be "0", the element consists of an FET whose gate is connected to the match $j$ line, whose source is connected to ground, and whose drain is connected to a current source 506-$i$. Each current source 506-$i$ is connected to the drains of all elements 504-$i,k$ for $k=0$ to 255, that are associated with the length $i$ output bit, for $i=0$ to 3, to form the ith "bit line", which is connected to a sense amplifier 507-$i$, to produce the output length bit. When match line $i$ is "on", the FETs connected to that line turn "on", grounding the connected length bit line and producing a "0" at the output of the sense amplifier associated with that line. For those elements consisting of the absence of an FET, denoted in the FIG. 5 as having an "X" drawn through the FET, such as element 504-3,0, the length bit lines remain "on" ("high"), to produce a "1" at the output of the associated length line.

In a similar manner, in the word plane each element 505-$i,j$, for $i=0$ to 7 and $j=0$ to 255, is associated with match line $j$ and a current source 508-$i$. A data bit is produced at the output of each sense amplifier 509-$i$, depending on which match line is "on", and whether an FET is present or absent at the intersection of that match line and the data line.

Figure 6:
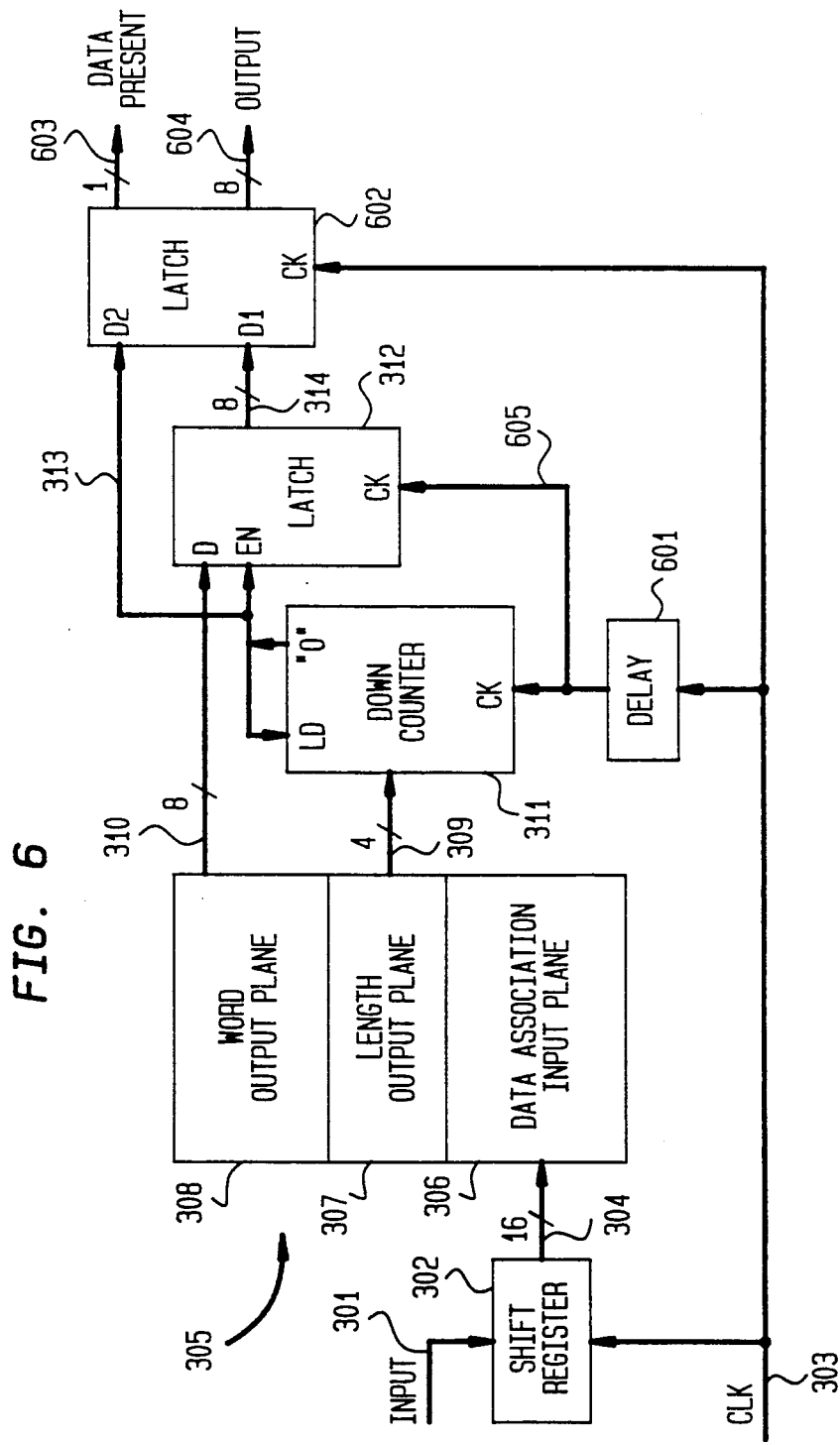
FIG. 6 shows an embodiment of the present invention with improved the speed capabilities.

A modification of the embodiment of the present invention of FIG. 3 is shown in FIG. 6. In the embodiment in FIG. 6, similar numerical designations are given to those elements common to FIGS. 3 and 6. In this embodiment, "analog pipelining" (delay-matching) techniques are employed to increase the speed capabilities of the decoder. In accordance with this technique, a delay element 601 is introduced in the path between the system clock signal on lead 303 and the CK clock inputs of downcounter 311 and output latch 312. The amount of the time delay of element 601 would normally be selected to be less than the response delay of the PLA memory device 305. By delaying the clock input over lead 605 to downcounter 311 and latch 312, the PLA memory device 305 is given additional time to produce an output for a given operating speed. Thus, for a given PLA speed, the decoder can operate at a higher speed. By introducing a delay to the clock input of downcounter 311 and latch 312, the "0" count output of downcounter 311 on lead 313, and the decoded word output of latch 312 on leads 314 are also delayed, both of which must then be realigned with the system clock. Accordingly, a retiming register, consisting of a dual input latch 602, is employed to retime the "0" count signal and the decoded word output back onto normal clock timing. By applying the "0" count output lead 313 of downcounter 311 to a first D1 input of dual latch 602 and the parallel decoded word output of latch 312 to the second set of D2 inputs of latch 602, which is clocked by the undelayed system clock on lead 303, the timing of the data present signal on lead 603 and the decoded word output on parallel leads 604 is restored. This speed enhancing modification could not be made to a decoder that did not have the feedforward property of the decoder of the present invention.

Figure 7:
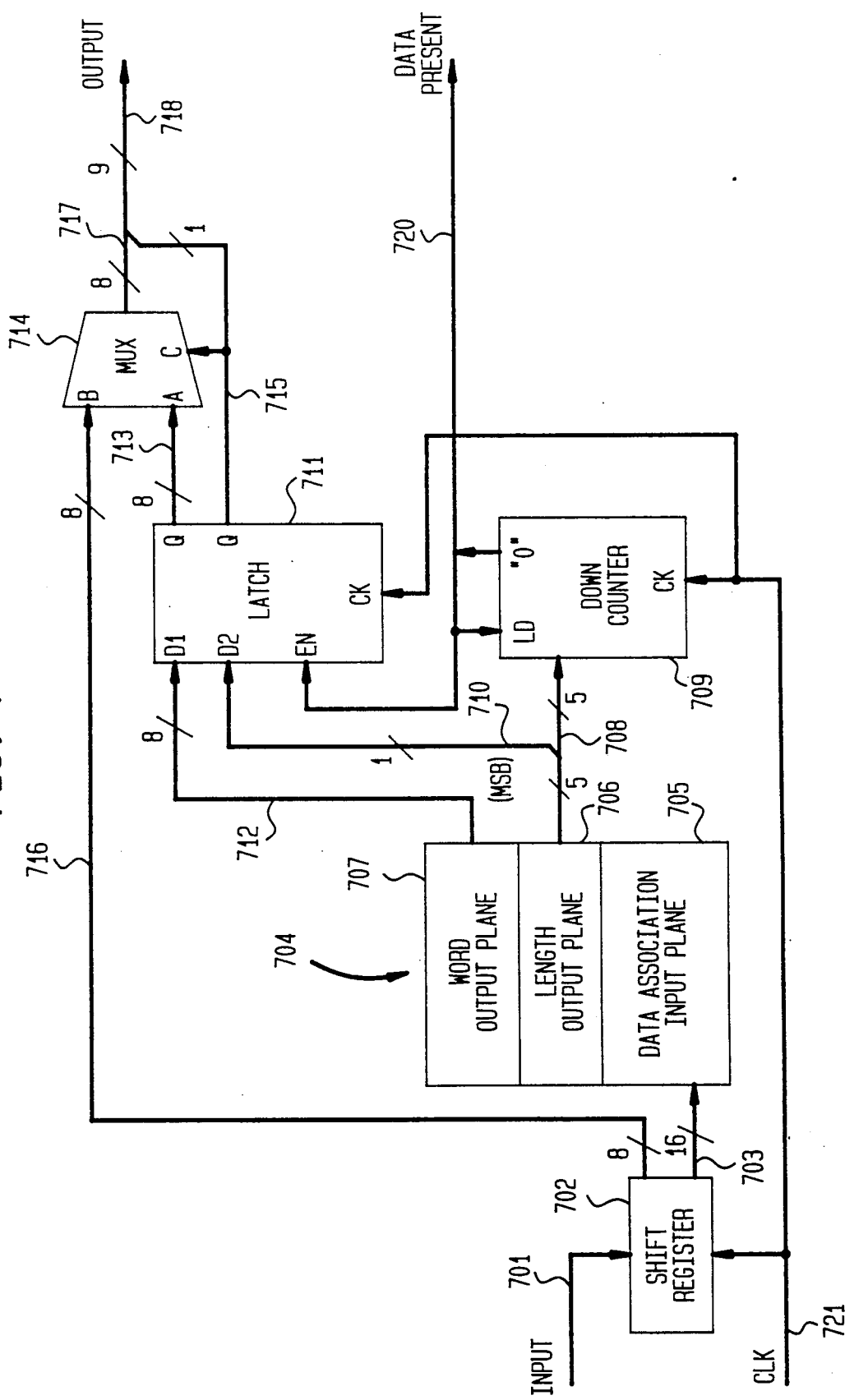
FIG. 7 shows and embodiment of the present invention which incorporates a prefix coding capability.

FIG. 7 shows an alternative embodiment of the present invention that has the capability of decoding additional codewords without the necessity of increasing the width of the memory device. In this embodiment prefix decoding is used. In particular, a codeword is used to instruct the decoder to read a next set of bits "in the clear" and to form the complete decoded word by combining some bits corresponding to the prefix with the bits read in the clear.

The decoder shown in FIG. 7 has the capability of decoding 255 ordinary VWL words plus 256 extended data words with the same 256 column wide PLA memory as in the decoder of FIG. 3. As will be noted, however, the height of the length output plane is increased from four to five bits to handle word lengths greater than 16. In this embodiment, upon detection of a particular 16-bit codeword, the next eight bits in the input bit stream are read in the clear and combined with one additional bit to form a 9-bit word output. Here that additional bit is the MSB of the length output of the PLA memory device 704, indicating whether the remaining eight bits were taken from the input bit stream "in the clear" or from the ordinary word output plane 707 of the PLA memory device 704.

The decoder in FIG. 7 functions substantially identical to the decoder in FIG. 3. The input bit stream on lead 701 is input to a shift register 702 which has a 24-bit length rather than the 16-bit length shift register in the decoder in FIG. 3. The lower 16 bits on leads 703 are input to the data association input plane 705 of memory device 704. As in the decoder of FIG. 3, memory device 704 has a 256 codeword wide data association input plane 705, and associated length output plane 706 and word output plane 707. As noted, the height of the length output plane 706 is five bits and the height of the word output plane 707 is eight bits, the latter as in the decoder of FIG. 3. When a VWL word is recognized by the data association input plane 705, its length word is output by length output plane 706 onto leads 708 and loaded into downcounter 709. The most significant bit (MSB) of its 5-bit binary representation is output on lead 710. For ordinary VWL words having bit lengths of 16 or less, this bit is "0". For prefix words, whose total bit occupancy in the input stream is 24 bits, this bit is "1". Lead 710 is connected to the second D2 input of a dual input/output latch 711. The eight parallel outputs 712 of the word output plane 707 are connected to the first D1 input of latch 711. The Q outputs 713 of latch 711 associated with these first D inputs from the word output plane 707 are connected to a first A input of a multiplexor 714. The Q output 715 of latch 711 associated with the second D input from the MSB of the length output plane, is connected to the control input C of multiplexor 714. The second B input of multiplexor 714 is connected to the top eight bit register positions of shift register 702 over leads 716. The output of multiplexor 714, on eight parallel leads 717, is equal to either its A or B inputs, consisting of either the top eight bits of shift register 702 or the eight bits on leads 713 at the output of latch 711. The selection of the A or B inputs is determined by the presence of a "0" or a "1" on lead 715, respectively, which is determined by the MSB on lead 710 at the output of length output plane 706. The output of the decoder on leads 718 is formed by combining the eight parallel output bits of multiplexor 714 with the single bit on lead 715.

For simplicity, the the above-description ignores the need for proper time alignment of the data on lines 716 with the decoded information on lines 713 and 715. The latter is late by one clock cycle due to processing latency introduced by latch 711. This could be corrected by inserting a latch in the path of lines 716. However, this is more efficiently dealt with by connecting leads 716 at a point one tap lower in shift register 702. The shift register then needs only to be 23 stages long.

For "ordinary" VWL codewords having 16 bits or less, correspondence is made between the sequence of 16 bits on leads 703 then in the bottom 16 register positions of shift register 702, and one of the columns in the data association input plane 705. The associated length word stored in length output plane 706 is loaded into downcounter 709 and the associated fixed length word stored in word output plane 707 is outputted over leads 712 to latch 711. The MSB of the output of the length output plane on lead 710 is "0" since the stored length word is less than 16. As in the decoder of FIG. 3, at the instant when a word is detected, the count of downcounter 709 is initially at zero which energizes Data Present lead 720 and enables latch 711. The 8-bit fixed length word on leads 712 and the single "0" MSB bit on lead 710 are thus latched by latch 711 to its Q outputs on leads 713 and 715, respectively. Since a "0" resides on lead 715, multiplexor 714 selects the A input for output onto leads 717. These bits are combined with the "0" on lead 715 to produce a 9-bit output word on leads 718, whose initial MSB bit is "0". As in the decoder of FIG. 3, downcounter 709 disables latch 711 for the number of clock pulses on CLK lead 721 equal to the length of the just detected VWL codeword. Thus, as in the decoder of FIG. 3, the decoder is always functioning in a feed forward mode and no feedback to the decoder input of codeword length is required.

For prefix controlled code words, one 16-bit word is reserved as a prefix indicator. When this word is detected by the data association table 705, the length output plane 706 outputs a binary "23" which is loaded into downcounter 709. The MSB on lead 710 is now "1", which when latched by latch 711, produces a "1" on lead 715, which enables multiplexor 714 to select its B input for output, which, as noted, is the top eight of the 24 bits then in shift register 702. These eight "in the clear" bits on leads 716 are combined with the "1" on lead 715 to form the 9-bit output word on output leads 718, whose MSB is "1". The "23" that is loaded into downcounter 709 inhibits latch 711 from transferring invalid "noise" outputs from the word and length output planes 707 and 706 to its Q outputs until the 24 bits residing in shift register 702 have been clocked out.

Other variations on prefixing are also possible. For example, more than one prefix can be used, so that the "clear" word can be interpreted differently depending on which VWL word caused the branch to the clear word. The still-available data word corresponding to that VWL word can be used in forming an appropriate distinguishing prefix instead of being discarded as in the decoder in FIG. 7. Branches can also be made to words sent in the clear that are also of variable length by merely putting the appropriate length into the length output plane and properly prefixing any unused bits of the byte reserved for processing words sent in the clear. Again, the still-available data word corresponding to the VWL portion of the word can be used in forming the appropriate prefix. Although it has been suggested by example that the VWL portion of the word that is reserved as the prefix indicator is a 16-bit word, it can be a smaller word as well. For example, a 12-bit VWL prefix indicator word could call for reading in the clear of the subsequent 8 bits, for a total word length of 20 bits. Finally, some forms of multilevel (hierarchical) prefixing may make possible much faster VWL decoders by allowing the use of much smaller main VWL arrays for a given total number of available codes. This would essentially implement "thresholded" variable word length codes codes. The simple architecture of the feedforward VWL decoder of the present invention lends itself to any of these techniques.

The above-described embodiments are illustrative of the principles of the present invention. Other embodiments could be devised by those skilled in the art without departing from the spirit and scope of the present invention.

What is claimed is:

1. A variable word length (VWL) decoder for decoding an input bit stream of VWL codewords comprising:
    shift register means having a plurality of bit storage locations for storing a fixed number of consecutive bits from said input bit stream, the bit in the bottom bit storage location being the earliest-in-time of the consecutive bits from said input stream stored in said bit storage locations, the bits in said storage means being shifted downward in response to the pulses in a clocking signal;
    table-lookup memory means connected to the bit storage locations of said shift register means, said memory means having a stored input entry for each VWL codeword, and stored corresponding output entries for a representation of the length of each VWL codeword and for the fixed-length codeword associated with each VWL codeword, said memory means decoding a VWL codeword by comparing the bits in said bottom and higher bit storage locations with a VWL codeword input entry and for producing a first output equal to the corresponding representation of the codeword length and a second output equal to the corresponding fixed-length codeword;
    counting means connected to receive the representation of the codeword length at said first output of said memory means, said counting means counting clock pulses after each VWL word in the input bit stream is decoded by said memory means; and
    latching means connected to receive the fixed-length codeword at the second output of said memory means, said latching means controlled by said counting means to produce a decoded output equal to the fixed-length codeword at the second output of said memory means only when the number of clock pulses counted by said counting means indicates that all the bits in the previous VWL word have been shifted out of said shift register means and the second output of said memory device represents the fixed-length codeword associated with a VWL codeword whose first bit is located in the bottom bit storage location of the register means.

2. A variable word length decoder in accordance with claim 1 wherein said memory means is a programmable logic array.

3. A variable word length decoder in accordance with claim 1 wherein said shift register means has at least as many bit storage locations as the longest VWL codeword.

4. A variable word length decoder in accordance with claim 1 wherein said counting means is a downcounter which after being loaded with the representation of a codeword length decrements its count by one in response to each subsequent clock pulse.

5. A variable word length decoder in accordance with claim 4 wherein the codeword length representation of each VWL codeword is equal to one less than the codeword length, and said downcounter produces a signal when its count reaches zero that indicates to said latching means that all bits from the previous VWL word have been shifted out of said shift register means.

6. A variable word length decoder in accordance with claim 1 further comprising delay means for delaying the clock pulses to said counting means and said latching means, and second latching means for retiming the output of the first latching means to the timing of the pulses in the undelayed clocking signal.

7. A variable word length decoder in accordance with claim 1 wherein said memory means upon decoding a preselected VWL codeword generates a signal for indicating that a predetermined number of bits following that preselected VWL codeword are to be directly read to the decoder output, said decoder further comprising means for generating, when said signal is generated, a decoder output consisting of the combination of said predetermined number of bits following said preselected VWL codeword and at least one preselected bit from the output of said memory means.

8. A method of decoding an input stream of variable word length (VWL) codewords comprising the steps of:
- storing a fixed number input bits in consecutive bit order;
- in response to each clock pulse from a clocking signal, shifting the stored input bits by dropping the earliest-in-time stored bit and adding a new bit from the input stream to the end of the stored fixed number of bits;
- comparing the earliest-in-time and later-in-time consecutive stored bits with all possible VWL codewords to determine one particular matching codeword;
- generating a fixed-length codeword corresponding to the matching VWL codeword;
- generating a length-word that represents the bit-length of the matching VWL codeword;
- counting, after determining the matching codeword, a number of clock pulses equal to the value of the corresponding length-word;
- producing a decoder output word equal to the fixed-length codeword corresponding to the matching VWL codeword only when the count of clock pulses indicates that none of the stored bits are from a previous VWL codeword and the earliest-in-time stored bit corresponds to the first bit of the present VWL codeword, and ignoring any matches between the stored bits and all possible VWL codewords at any other count of clock pulses.

9. The method of claim 8 further comprising the step of:
- when the matching codeword is a preselected VWL codeword, forming a decoder output by combining a predetermined number of bits that directly follow that preselected word in the input bit stream with at least one bit that corresponds to either or both of the fixed-length codeword and the length-word corresponding to that preselected VWL codeword.

* * * * *